United States Patent
Ko et al.

(10) Patent No.: US 9,373,740 B1
(45) Date of Patent: Jun. 21, 2016

(54) WAVELENGTH CONVERTING STRUCTURE FOR NEAR-INFRARED RAYS AND SOLAR CELL COMPRISING THE SAME

(71) Applicant: KOREA INSTITUTE OF SCIENCE AND TECHNOLOGY, Seoul (KR)

(72) Inventors: Hyungduk Ko, Seoul (KR); Ho Seong Jang, Seoul (KR); Doo-Hyun Ko, Seoul (KR); Il Ki Han, Seoul (KR); Gi Yong Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/606,135

(22) Filed: Jan. 27, 2015

(30) Foreign Application Priority Data

Dec. 24, 2014 (KR) .......................... 10-2014-0187754

(51) Int. Cl.
  *H01L 31/055* (2014.01)
  *G02B 5/00* (2006.01)
  *B82Y 20/00* (2011.01)

(52) U.S. Cl.
  CPC .............. *H01L 31/055* (2013.01); *G02B 5/008* (2013.01); *B82Y 20/00* (2013.01); *Y10S 977/773* (2013.01)

(58) Field of Classification Search
  CPC .................................................... H01L 31/055
  USPC .................................................. 136/252, 256
  See application file for complete search history.

(56) References Cited

U.S. PATENT DOCUMENTS

2013/0000698 A1*  1/2013  Zhou et al. ............... G02B 5/10
                                              136/247

OTHER PUBLICATIONS

Karl W. Kramer, et al; "Hexagonal Sodium Yttrium Fluoride Based Green and Blue Emitting Upconversion Phosphors", Chemical Mater. vol. 16, pp. 1244-1251, Published on Web Mar. 2, 2004.
Stefan Schietinger, et al; "Plasmon-Enhanced Upconversion in Single $NaYF_4Yb^{3+}/Er^{3+}$ Codoped Nanocrystals", Nano Lett. vol. 10, pp. 134-138, Published on Web: Dec. 18, 2009.
Shu-Zhuo Zhang, et al; "Reversible luminescence switching of $NaYF_4:Yb_1Er$ nanoparticles with controlled assembly of gold nanoparticles†", Chem. Commun; pp. 2547-2549; First published as an Advance Article on the web Mar. 16, 2009.
Weihua Zhang, et al; "Large Enhancement of Upconversion Luminescence of $NaYF_4:Yb^{3+}/Er^{3+}$ Nanocrystal by 3D Plasmonic Nano-Antennas", Advanced Materials, vol. 245, pp. OP236-OP241; Article first published online Jul. 3, 2012.

* cited by examiner

*Primary Examiner* — Susan D Leong
(74) *Attorney, Agent, or Firm* — Ladas & Parry LLP (57) ABSTRACT

Provided is a wavelength converting structure for near-infrared rays and a solar cell using the same. More particularly, provided is a novel wavelength converting structure for near-infrared rays using gap plasmon characteristics and up-conversion nanoparticles. When applying the wavelength converting structure for near-infrared rays to a solar cell, it is possible to convert the light within a wavelength range of near-infrared rays into electric energy so that the photoconversion efficiency may be improved.

20 Claims, 7 Drawing Sheets

SiO2 → UC → SiO2

WAVELENGTH CONVERTING STRUCTURE FOR NEAR-INFRARED RAYS AND SOLAR CELL COMPRISING THE SAME

CROSS-REFERENCE TO RELATED APPLICATIONS

This application claims priority under 35 U.S.C. §119 to Korean Patent Application No. 10-2014-0187754 filed on Dec. 24, 2014, in the Korean Intellectual Property Office, the disclosure of which is incorporated herein by reference in its entirety.

TECHNICAL FIELD

The following disclosure relates to a wavelength converting structure for near-infrared rays and a solar cell using the same. More particularly, the following disclosure relates to a novel wavelength converting structure for near-infrared rays using gap plasmon and up-conversion nanoparticles, and a solar cell using the same and capable of converting the light in a wavelength range of near-infrared rays into electric energy so that the photoconversion efficiency may be improved.

BACKGROUND

In general, surface plasmon refers to quantized collective vibration of charge density on a metal surface. The surface plasmon is combined with various electronic waves, such as visible rays and infrared rays provided under specific conditions, and is allowed to propagate along the boundary surface between a metal and a dielectric substance, thereby forming surface plasmon polariton.

The surface plasmon generated in metal nanoparticles with a nanometer size is confined in the metal nanoparticles and vibrates therein. Herein, the resultant surface plasmon polariton is referred to as localized surface plasmon polariton.

The above-mentioned plasmon phenomenon has been used to realize a nanophotonics device below the diffraction limit, or to develop a light emitting diode (LED), solar cell and a sensor using a strong effect of enhancing electromagnetic field.

Meanwhile, an up-conversion substance is one capable of converting electromagnetic waves with a long wavelength into those with a short wavelength. Basically, such an up-conversion substance is a material absorbing two or more low-energy photons to emit one high-energy photon.

Studies about such an up-conversion substance are slightly insufficient as compared to the quantum dot or a down-shifting substance. However, according to the reports up to date, $NaYF_4$ doped with both ytterbium (Yb) and erbium (Er) is being developed. Such $NaYF_4$ includes the most efficient particles characterized in that they convert near-infrared rays into visible rays. However, in this case, the photoluminescence efficiency of up-conversion is less than 3%, which is significantly low. Thus, there is a problem related with commercialization (Non-patent Document 1).

Therefore, many studies have been conducted to date to solve the above-mentioned problem. However, according to the related art, there is no increase in photoluminescence intensity (Non-patent Document 2), or the photoluminescence intensity merely increases by 3.8 times up to at most 310 times (Non-patent Documents 3 and 4).

Thus, the up-conversion substances according to the related art have insufficient photoluminescence intensity, and have difficulty in commercialization because they are produced through complicated processes and conditions.

Under these circumstances, the present inventors have conducted intensive studies. The inventors have found that when up-conversion nanoparticles are inserted into a metal-insulator-metal structure, gap plasmon formed by a combination of localized surface plasmon with surface plasmon polariton may be excited to maximize the wavelength converting efficiency and photoluminescence intensity. The present invention is based on this finding.

REFERENCES

Non-patent Documents

Non-patent Document 1: Chem. Mater. Vol. 16, 1244-1251 (2004)
Non-patent Document 2: Nano Lett. Vol. 10, 134-138 (2010)
Non-patent Document 3: Chem. Commun. Vol. 18, 2547-2549 (2009)
Non-patent Document 4: Adv. Mater, Vol. 24, OP236-OP241 (2012)

SUMMARY

An embodiment of the present disclosure is directed to providing a wavelength converting structure for near infrared rays, which uses gap plasmon characteristics to realize a strong effect of enhancing electromagnetic field so that the low photoluminescence intensity of an up-conversion substance may be improved and the wavelength conversion efficiency may be maximized.

Another embodiment of the present disclosure is to provide a solar cell including the above-mentioned wavelength converting structure for near infrared rays to convert the light with a wavelength range of near infrared rays, which otherwise is not absorbed into a photoactive layer but is lost, into the visible rays, thereby improving the photoconversion efficiency.

In one aspect, there is provided a wavelength converting structure for near infrared rays, including: a first metal layer; a first spacer layer attached to the surface of the first metal layer; an up-conversion nanoparticle layer dispersed onto the surface of the first spacer layer; a second spacer layer formed on the up-conversion nanoparticle layer; and a second metal layer including a plurality of metal nanoparticles formed on the second spacer layer.

According to an embodiment, the wavelength converting structure for infrared rays converts near infrared rays with a wavelength range of 900-1500 nm into visible rays with a wavelength range of 400-800 nm.

According to another embodiment, the wavelength converting structure for near infrared rays further includes a substrate on the bottom surface of the first metal layer.

According to still another embodiment, each of the first spacer layer and the second spacer layer independently includes a semiconductor material, oxide, nitride or a mixture thereof.

According to still another embodiment, the spacer layer has a thickness of 1-60 nm.

According to still another embodiment, the metal nanoparticles of the second metal layer are formed periodically or non-periodically.

According to still another embodiment, when the metal nanoparticles are formed non-periodically, they may be in the form of islands and the island-like metal nanoparticles are dispersed irregularly.

According to still another embodiment, when the metal nanoparticles are formed periodically, they may have any one shape selected from the group consisting of a triangle, circle, ellipse, rhombus and a polygon having a predetermined curvature.

According to still another embodiment, the metal nanoparticles are aligned at an interval of 10-500 nm.

According to still another embodiment, each of the first metal layer and the second metal layer independently includes at least one metal selected from the group consisting of gold, silver, aluminum, nickel, cobalt, iron, zinc, chrome and platinum.

According to still another embodiment, the up-conversion nanoparticles have a diameter of 5-100 nm.

According to yet another embodiment, the up-conversion nanoparticle is any one selected from the group consisting of halides, chalcogenides and metal oxides doped with ytterbium (Yb), erbium (Er) or a mixture thereof.

In another aspect, there is provided a solar cell including: a first electrode layer including the wavelength converting structure for near infrared rays; a first transparent electrode layer formed on the first electrode layer; a photoactive layer formed on the first transparent electrode layer; a second transparent electrode layer formed on the photoactive layer; and a second electrode layer formed on the second transparent electrode layer.

According to an embodiment, each of the first transparent electrode layer and the second transparent electrode layer includes any one transparent conductive metal oxide selected from the group consisting of indium tin oxide (ITO), fluorine tin oxide (FTO), indium zinc oxide (IZO), tin oxide (TO), antimony tin oxide (ATO), zinc oxide, Al-doped zinc oxide, cadmium oxide (CdO), cadmium tin oxide ($CdSnO_4$) and a mixture thereof.

As disclosed herein, there is provided a novel wavelength converting structure for near infrared rays using gap plasmon characteristics and up-conversion nanoparticles. When solar rays are input to the wavelength converting structure for near infrared rays, the rays with a wavelength range of near infrared rays of the incident rays are converted into the rays with a wavelength range of visible rays, while the visible light or low-intensity light is amplified. As a result, it is possible to maximize the wavelength conversion efficiency.

Therefore, the wavelength converting structure for infrared rays converts the rays with a wavelength range, which otherwise are transmitted or lost in the case of a conventional solar cell, into electric energy, and thus a solar cell using the same provides higher photoconversion efficiency.

DETAILED DESCRIPTION OF EMBODIMENTS

The advantages, features and aspects of the present disclosure will become apparent from the following description of the embodiments with reference to the accompanying drawings, which is set forth hereinafter.

In general, a solar cell uses the light within a visible wavelength range as energy and does not utilize the light with a wavelength of 300 nm or less or 800 nm or more. Particularly, because the light energy in the above-defined wavelength range of infrared rays is not capable of exciting a photoactive substance present in its ground state into its excited state, the light energy is merely lost or accumulated in a solar cell as heat energy. Due to this, the internal temperature of a solar cell increases, resulting in degradation of the life characteristics, stability or reliability required for commercialization.

Therefore, there is provided a novel wavelength converting structure for near infrared rays including up-conversion nanoparticles inserted into a metal-insulator-metal structure. The novel wavelength converting structure for near infrared rays converts the light with a wavelength range of near infrared rays, which has not been converted into electric energy in a solar cell according to the related art, into the light with a visible wavelength range, while amplifying the photoluminescence intensity, thereby maximizing the wavelength conversion efficiency of up-conversion nanoparticles.

Figure 1A:
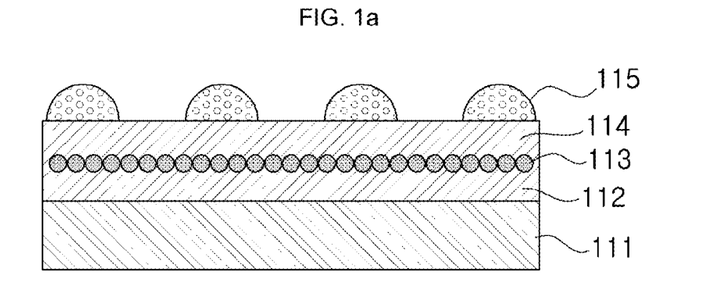
FIG. 1a and 1b are sectional view illustrating a wavelength converting structures for near infrared rays according to embodiments.

In one aspect, the wavelength converting structure for near infrared rays, includes: a first metal layer 111; a first spacer layer 112 attached to the surface of the first metal layer 111; an up-conversion nanoparticle layer 113 dispersed onto the surface of the first spacer layer 112; a second spacer layer 114 formed on the up-conversion nanoparticle layer 113; and a second metal layer 115 including a plurality of metal nanoparticles formed on the second spacer layer 114. FIG. 1a shows the structure of the wavelength converting structure for near infrared rays.

Figure 1B:
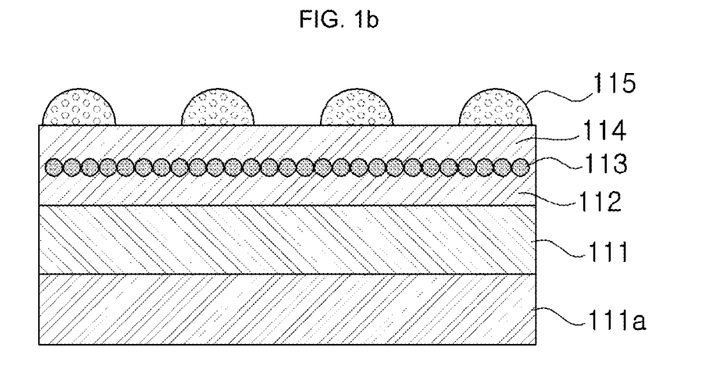

The wavelength converting structure for near infrared rays may further include a substrate 111a on the rear surface of the first metal layer 111. This is shown in FIG. 1b. The substrate 111a includes any material with no particular limitation, as long as it supports the wavelength converting structure for near infrared rays as disclosed herein. For example, the substrate may be a mono-crystalline, poly-crystalline or amorphous substrate including silicon (Si) or glass.

The first metal layer 111 may include any metallic material with no particular limitation. More particularly, the first metal layer may include at least one selected from the group consisting of gold, silver, aluminum, nickel, cobalt, iron, zinc, chrome and platinum.

Each of the first spacer layer 112 and the second spacer layer 114 independently includes any one material selected from the group consisting of semiconductor substances, oxides, nitrides and mixtures thereof. For example, the oxide may be any one selected from the group consisting of silica ($SiO_2$), tin oxide ($SnO_2$), titanium dioxide ($TiO_2$), zirconia ($ZrO_2$), alumina ($Al_2O_3$), indium tin oxide (ITO) and zinc oxide (ZnO).

Each of the first spacer layer 112 and the second spacer layer 114 may have a thickness of 1-60 nm. When each spacer layer has a thickness beyond the above-defined range, the wavelength converting structure for near infrared rays may have significantly decreased photoluminescence intensity.

The up-conversion nanoparticle layer 113 may be any one selected from the group consisting of halides, chalcogenides and metal oxides doped with rare earth metal ions. Herein, the rare earth metal ion may be ytterbium (Yb), erbium (Er) or a mixture thereof.

The up-conversion nanoparticles may have a diameter of 5-100 nm. This corresponds to the diameter range of up-conversion nanoparticles that allow conversion of near infrared rays with a wavelength range of 900-1500 nm into visible rays with a wavelength range of 400-800 nm. Thus, it is preferred to select the diameter of up-conversion nanoparticles within the above-defined range.

Despite such a small size, excitation of gap plasmon formed by a combination of localized surface plasmon with surface plasmon polariton characteristics allows the up-conversion nanoparticles to realize a very strong effect of enhancing electromagnetic field. Thus, it is possible to further increase the photoluminescence intensity and efficiency.

In addition, the up-conversion nanoparticle layer may be a single layer or a multi-layer structure formed by stacking multiple layers of up-conversion nanoparticles.

The second metal layer 115 may include a plurality of metal nanoparticles formed periodically or non-periodically in order to generate gap plasmon formed by a combination of localized surface plasmon with surface plasmon polariton characteristics.

In other words, when the second metal layer 115 is formed of a plurality of metal nanoparticles coated on the whole surface of the second spacer layer 114, it is not possible to generate a gap plasmon phenomenon in which a surface plasmon phenomenon is combined with a localized surface plasmon polariton phenomenon of strong local collection on the surface to provide a very strong effect of enhancing electromagnetic field at the second spacer layer 114 and the second metal layer 115. Therefore, it is necessary for the metal nanoparticles to be coated partially on the surface.

Herein, the metal nanoparticles forming the second metal layer 115 may be at least one selected from the group consisting of gold, silver, aluminum, cobalt, iron, zinc, chrome and platinum.

Figure 3:
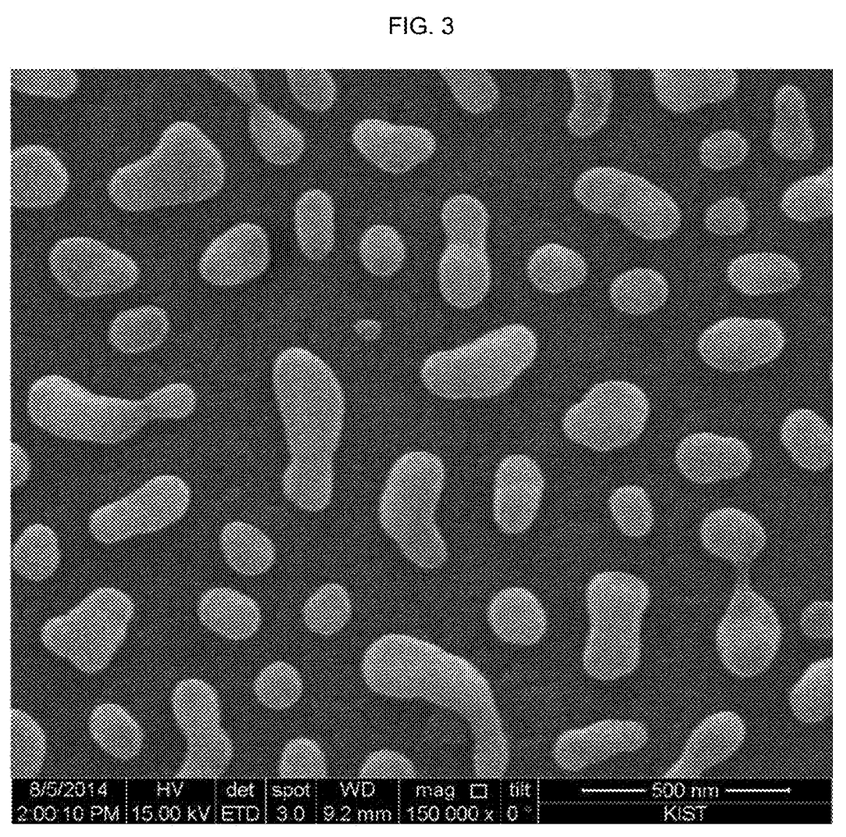
FIG. 3 is a scanning electron microscopy (SEM) image of the surface of the second metal layer in the wavelength converting structure for near infrared rays according to Example 1.
Figure 4:
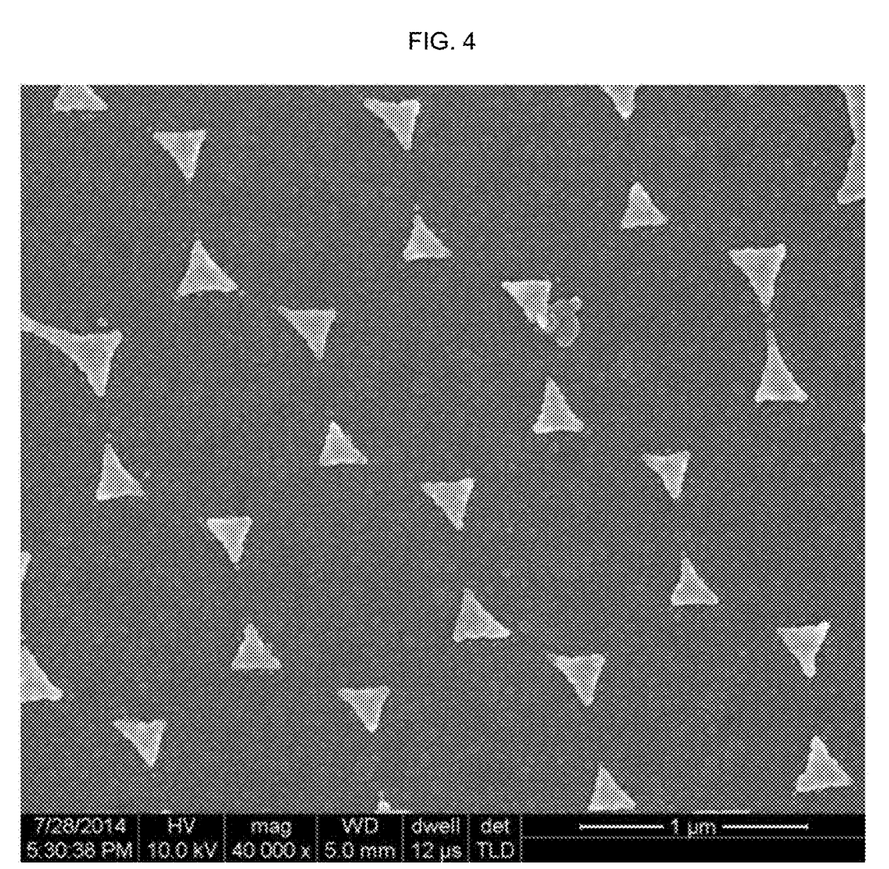
FIG. 4 is an SEM image of the surface of the second metal layer in the wavelength converting structure for near infrared rays according to Example 9.
Figure 5:
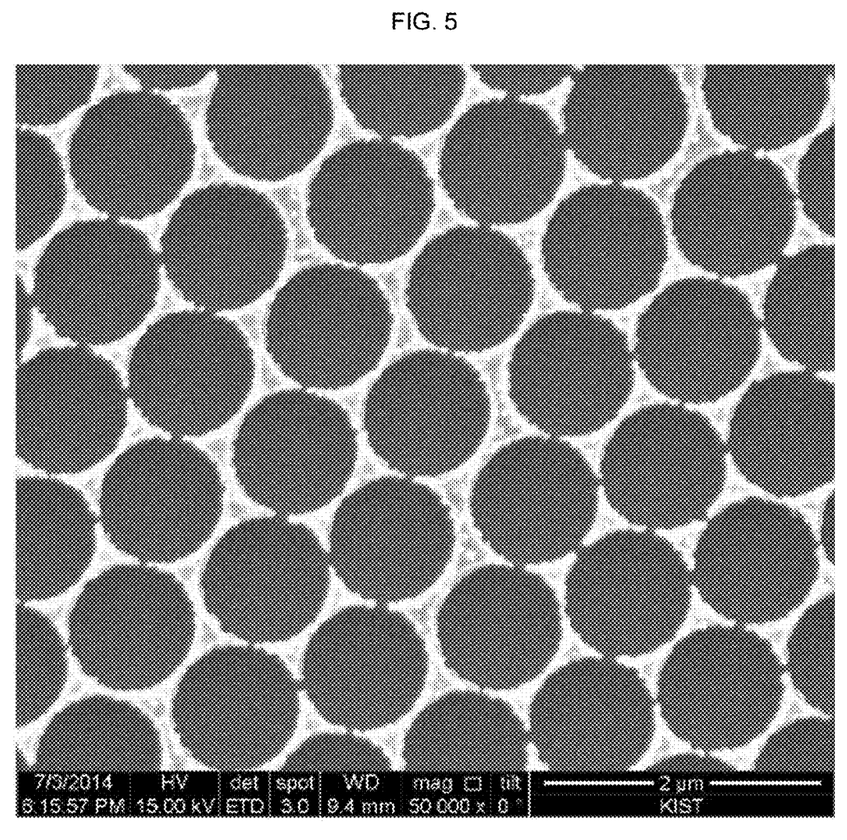
FIG. 5 is an SEM image of the surface of the second metal layer in the wavelength converting structure for near infrared rays according to Example 10.

Although each of FIG. 3, FIG. 4 and FIG. 5 illustrates an embodiment of the second metal layer 115, the present disclosure is not limited thereto. The second metal layer 115 may include metal nanoparticles in the form of a dome-like shape, oval shape, prism-like shape, pyramid shape, or the like without departing from the scope of the present disclosure.

More particularly, when the metal nanoparticles are formed non-periodically in the second metal layer 115, the metal nanoparticles may be dispersed irregularly in the form of islands.

Herein, the second metal layer 115 may be formed by depositing metal nanoparticles by using evaporation or sputtering, followed by heat treating the thin film thus deposited.

The heat treatment may be carried out at a temperature of 200-500° C. for 5-60 minutes. Under the above-mentioned heat treatment condition, it is possible for the metal substances formed in the second metal layer 115 to undergo crystallization effectively.

Meanwhile, when the metal nanoparticles are formed periodically, they may have any one shape selected from the group consisting of a triangle, circle, ellipse, rhombus and a polygon having a predetermined curvature. The metal nanoparticles may be aligned at an interval of 10-500 nm.

Thus, when the second metal layer 115 is formed periodically, the metal nanoparticles may be deposited through any one process selected from electron beam lithography, ion beam milling, nanosphere lithography, nanoimprinting, phase separation caused by block copolymers, photolithography and laser interference lithography, or evaporation or sputtering, and then the thin film thus deposited may be subjected to a nanopatterning process to form the second metal layer.

In the second metal layer 115, the bump may have a diameter of 10-300 nm and a height of 20-200 nm. When each bump present in the pattern layer has a diameter less than 10 nm or more than 300 nm, the gap plasmon resonance effect is reduced, resulting in degradation of up-conversion photoluminescence efficiency.

In addition, when the bump of the second metal layer 115 has a height less than 20 nm, the incident wavelength for excitation is transmitted, and thus the gap plasmon effect in which localized surface plasmon is combined with surface plasmon polariton cannot be realized sufficiently. On the other hand, when the bump has a height more than 200 nm, the incident wavelength for excitation may be reflected, and thus the gap plasmon effect cannot be realized sufficiently.

The wavelength converting structure for near infrared rays is a metal-insulator-metal structure that includes a first metal layer, a first spacer layer, a second spacer layer and a second metal layer. In the structure, an up-conversion nanoparticle layer is inserted between the first spacer layer and the second spacer layer so that the efficiency of up-conversion nanoparticles may be maximized.

Since the novel structure shows a very strong effect of enhancing electromagnetic field through the excitation of gap plasmon in which localized surface plasmon is combined with surface plasmon polariton, it is possible to maximize the photoluminescence intensity and wavelength conversion efficiency of up-conversion nanoparticles.

The near infrared rays input to the wavelength converting structure for near infrared rays disclosed herein are collected locally on the metal nanoparticles, i.e., the surface of the first and second metal layers through the gap plasmon resonance. At that time, strong multiple scattering occurs so that the wavelength conversion efficiency may be maximized.

In other words, in the wavelength converting structure for near infrared rays disclosed herein, the incident light generates collective oscillation of conduction band electrons (i.e., gap plasmon in which locally and highly increased localized surface plasmon is combined with surface plasmon) along the interface between the first metal layer 111 and the first spacer layer 112 and the interface between the second metal layer 115 and the second spacer layer 114. Then, this is transferred to the up-conversion nanoparticles provided between the first spacer layer 112 and the second spacer layer 114. As a result, it is possible to convert the near infrared rays within a range of 900-1500 nm into the visible rays within a range of 400-800 nm with high wavelength conversion efficiency.

Therefore, the wavelength converting structure including up-conversion nanoparticles disclosed herein may have a photoluminescence intensity approximately 1,000 times higher than the photoluminescence intensity of the conventional up-conversion nanoparticles under the same condition. In addition, even though the incident light or converted light has lower power density, it is possible to increase photoluminescence intensity significantly.

Figure 2:
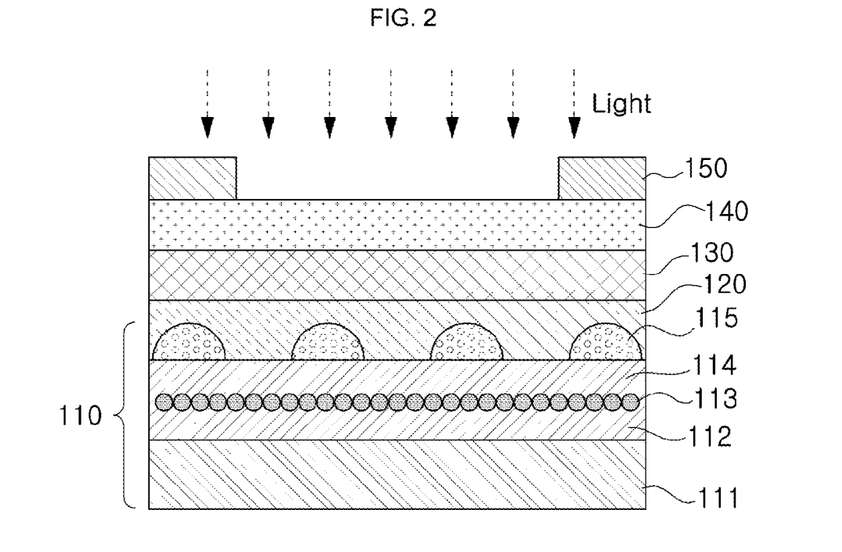
FIG. 2 is a sectional view illustrating a solar cell using a wavelength converting structure for near infrared rays according to an embodiment.

In another aspect, there is provided a solar cell including the above-described wavelength converting structure for near infrared rays. FIG. 2 illustrates the structure of the solar cell.

FIG. 2 is a sectional view illustrating the structure of the solar cell using the wavelength converting structure according to an embodiment.

Referring to FIG. 2, the solar cell includes a first electrode layer 110 including the wavelength converting structure for near infrared rays, a first transparent electrode layer 120 formed on the first electrode layer 110, a photoactive layer 130 formed on the first transparent electrode layer 120, a second transparent electrode layer 140 formed on the photoactive layer 130, and a second electrode layer 150 formed on the second transparent electrode layer 140.

The first electrode layer 110 includes a wavelength converting structure having any one structure selected from the above-described embodiments. Each embodiment of the wavelength converting structures for near infrared rays has been described in detail hereinbefore, and thus detailed description thereof will be omitted for the purpose of simplicity.

Each of the first transparent electrode layer 120 and the second transparent electrode layer 140 includes a transparent conductive metal oxide selected from the group consisting of indium tin oxide (ITO), fluorine tin oxide (FTO), indium zinc oxide (IZO), tin oxide (TO), antimony tin oxide (ATO), zinc oxide, Al-doped zinc oxide, cadmium oxide (CdO), cadmium tin oxide ($CdSnO_4$) and a mixture thereof.

Each of the first transparent electrode layer 120 and the second transparent electrode layer 140 may be formed of one or more layers of the transparent conductive metal oxide. Particularly, it is preferred to use indium tin oxide (ITO) having a high work function for use in coating.

Herein, the first transparent electrode layer 120 and the second transparent electrode layer 140 may be formed through any one known process selected from sputtering, vapor phase deposition and ion beam deposition.

The second electrode layer 150 may be a metal having a low work function. More preferably, the metal may be any one selected from the group consisting of gold (Au), silver (Ag), aluminum (Al), calcium (Ca), magnesium (Mg), vanadium V, molybdenum (Mo), Al—Mg and LiF—Al.

The photoactive layer 130 may include any material converting the energy of incident light into electric energy. For example, the photoactive layer 130 may include an amorphous silicone-based material, compound-based material, organic compound-based material and a photoelectric conversion material capable of forming a thin film type solar module such as a dye sensitive solar cell. As a compound-based material, it is possible to use CIGS($CuInGaSe_2$), CdTe, CIS($CuInSe_2$), CZTS($Cu_2ZnSnS_4$), or the like. In addition, the photoactive layer 130 may include one or more layers. The photoactive layer 130 may include a laminate of two layers or three layers. Each layer of the laminate means a basic unit layer performing photoelectric conversion.

The solar cell absorbs the infrared rays or visible rays, which are not absorbed to the photoactive layer but transmitted therethrough, by way of the first electrode layer including the wavelength converting structure for near infrared rays and converts the same into visible rays, or amplifies the wavelength and remits the amplified wavelength to the photoactive layer. As a result, the solar cell reduces the energy loss and improves the photo electric conversion efficiency.

In addition, the wavelength converting structure for near infrared rays provided as the first electrode layer 110 has photoluminescence quality approximately 1,000 times higher than the photoluminescence quality of the conventional up-conversion nanoparticles. Thus, the solar cell using the wavelength converting structure for near infrared rays shows significantly higher photoconversion efficiency as compared to the conventional solar cells using up-conversion particles or a surface plasmon structure.

The examples and experiments will now be described. The following examples and experiments are for illustrative purposes only and not intended to limit the scope of this disclosure.

EXAMPLE 1

Up-conversion nanoparticles having a composition of 6-$NaY_{0.8}F_4$:$Yb^{3+}_{0.18}$,$Er^{3+}_{0.02}$ are prepared before a wavelength converting structure for near infrared rays is produced.

First, 0.8 mmol of yttrium chloride hydrate, 0.18 mmol of ytterbium chloride hydrate and 0.02 mmol of erbium chloride hydrate are mixed with a solvent containing 6 ml of oleic acid and 15 ml of 1-octadicene to provide a first mixed solution, followed by heating to 150° C. To the heated first mixed solution, a second mixed solution containing sodium hydroxide and ammonium fluoride mixed with methanol is added. Then, the resultant mixture is agitated to provide a solution for reaction. Methanol is removed from the solution for reaction. Then, under nitrogen atmosphere, heat treatment is carried out at 300° C. for 90 minutes. In this manner, up-conversion nanoparticles having a composition of $\beta$-$NaY_{0.8}F_4$:$Yb^{3+}_{0.18}$,$Er^{3+}_{0.02}$ are obtained.

Next, a first metal layer of Ag is formed to a thickness of 100 nm, and a first spacer layer of silica ($SiO_2$) is deposited on the first metal layer to a thickness of 5 nm. The solution containing the up-conversion nanoparticles (20 nm) thus obtained is applied to the surface of the first spacer layer and subjected to spin coating to form an up-conversion nanoparticle layer.

Then, a second spacer layer of silica (SiO2) is deposited on the up-conversion nanoparticle layer to a thickness of 5 nm. After that, a thin film of Ag is deposited to form a second metal layer having irregularly formed islands including a plurality of metal nanoparticles on the surface of the second spacer layer. Then, heat treatment is carried out at 350° C. for 15 minutes to obtain a wavelength converting structure for near infrared rays.

EXAMPLE 2

A wavelength converting structure for near infrared rays is obtained in the same manner as described in Example 1, except that each of the first spacer layer and the second spacer layer is deposited to a thickness of 8 nm.

EXAMPLE 3

A wavelength converting structure for near infrared rays is obtained in the same manner as described in Example 1, except that each of the first spacer layer and the second spacer layer is deposited to a thickness of 10 nm.

EXAMPLE 4

A wavelength converting structure for near infrared rays is obtained in the same manner as described in Example 1, except that each of the first spacer layer and the second spacer layer is deposited to a thickness of 20 nm.

EXAMPLE 5

A wavelength converting structure for near infrared rays is obtained in the same manner as described in Example 1, except that each of the first spacer layer and the second spacer layer is deposited to a thickness of 30 nm.

EXAMPLE 6

A wavelength converting structure for near infrared rays is obtained in the same manner as described in Example 1, except that each of the first spacer layer and the second spacer layer is deposited to a thickness of 40 nm.

EXAMPLE 7

A wavelength converting structure for near infrared rays is obtained in the same manner as described in Example 1, except that each of the first spacer layer and the second spacer layer is deposited to a thickness of 50 nm.

EXAMPLE 8

A wavelength converting structure for near infrared rays is obtained in the same manner as described in Example 1, except that each of the first spacer layer and the second spacer layer is deposited to a thickness of 60 nm.

EXAMPLE 9

A wavelength converting structure for near infrared rays is obtained in the same manner as described in Example 1, except that a second metal layer in which isosceles triangle-like metal nanoparticles are aligned at a predetermined interval is formed by using nanoimprinting.

EXAMPLE 10

A wavelength converting structure for near infrared rays is obtained in the same manner as described in Example 1, except that a second metal layer in which hole-like patterned metal nanoparticles are aligned at a predetermined interval is formed by using nanoimprinting.

COMPARATIVE EXAMPLE 1

A wavelength converting structure for near infrared rays is obtained in the same manner as described in Example 1, except that up-conversion nanoparticles are applied onto a conventional glass substrate.

FIG. 3 is a scanning electron microscopy (SEM) image of the surface of the second metal layer in the wavelength converting structure for near infrared rays according to Example 1. As can be seen in FIG. 3, the second metal layer has an irregular pattern. Particularly, the island-like metal nanoparticles forming the second metal layer have a non-uniform island shape having a size of 10-500 nm on overage.

FIG. 4 and FIG. 5 show SEM images of the surface of the second metal layer in the wavelength converting structure for near infrared rays according to Example 9 and Example 10, respectively.

As shown in FIG. 4 and FIG. 5, the wavelength converting structure for near infrared rays according to Example 9 and Example 10 may include a second metal layer having a predetermined pattern on the surface of the second spacer layer through a nanoimprinting process.

In addition, the second metal layer includes a triangle-shaped or polygonal metal nanoparticles arranged regularly (periodically).

Figure 6A:
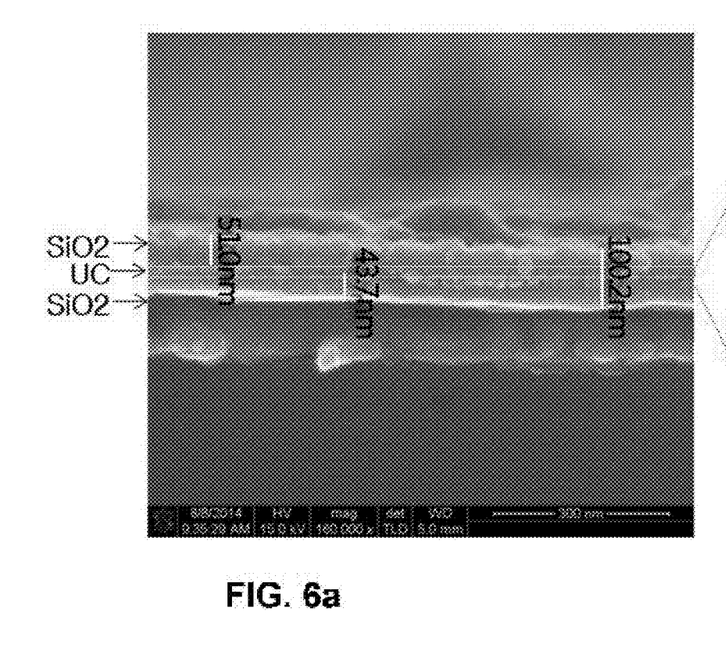
FIG. 6a is an SEM image illustrating the section of the wavelength converting structure for near infrared rays according to Example 7.
Figure 6B:
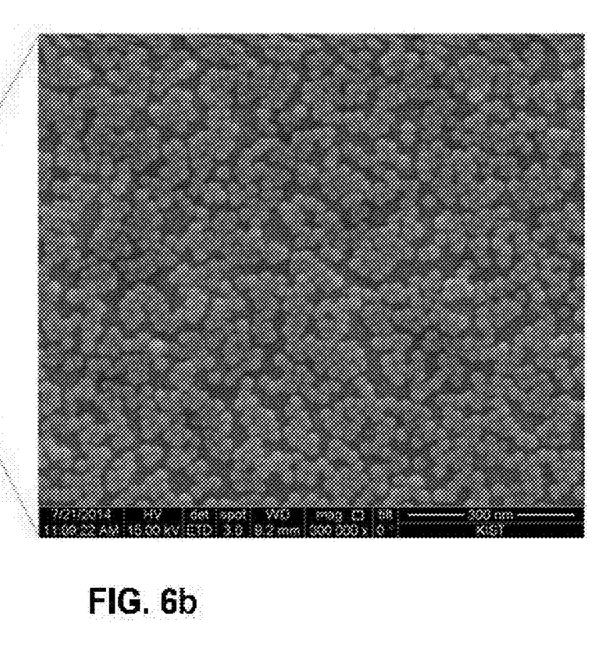
FIG. 6b is an SEM image illustrating the surface of the up-conversion nanoparticles coated on the first spacer layer.

FIG. 6a is an SEM image illustrating the section of the wavelength converting structure for near infrared rays according to Example 7, and FIG. 6b is an SEM image illustrating the surface of the up-conversion nanoparticles coated on the first spacer layer.

As shown in FIG. 6a, in the wavelength converting structure for near infrared rays according to Example 7, the up-conversion nanoparticle layer is formed uniformly between the first spacer layer and the second spacer layer.

In addition, it can be seen that each of the first spacer layer and the second spacer layer has a thickness of 43-51 nm, and the total thickness of the first spacer layer, up-conversion nanoparticle layer and the second spacer layer is 100 nm.

It can be seen from the above results that the up-conversion nanoparticle layer forms a uniform layer having a thickness of about 6 nm.

It can be also seen from FIG. 6b that the up-conversion nanoparticle layer is coated on the first spacer layer and forms a uniform monolayer thereon.

Figure 7:
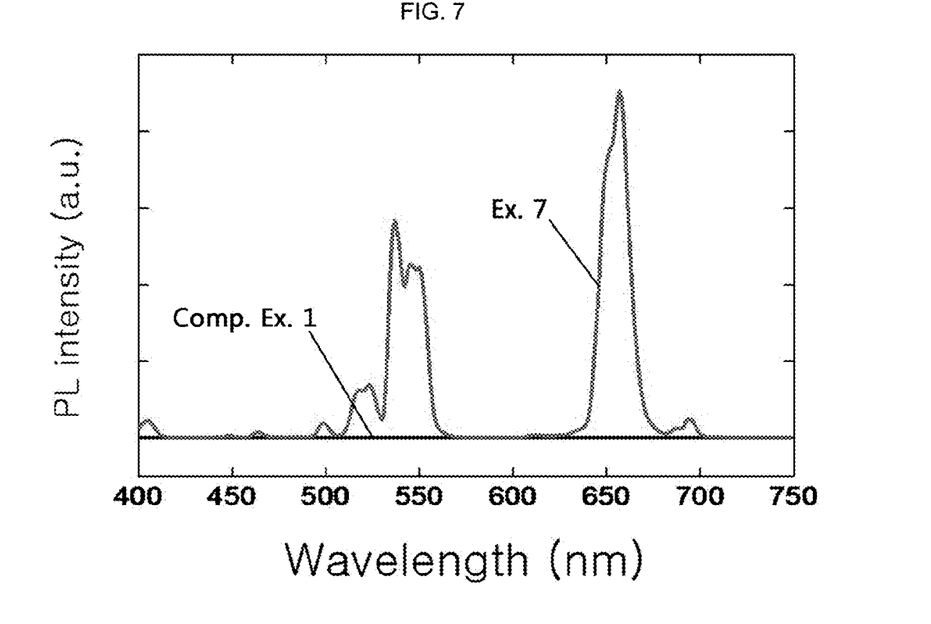
FIG. 7 is a graph illustrating the light intensity of the wavelength converting structure for near infrared rays according to Example 7 and that of the structure according to Comparative Example 1 upon the excitation to 972 nm.

FIG. 7 is a graph illustrating the light intensity of the wavelength converting structure for near infrared rays according to Example 7 and that of the structure according to Comparative Example 1 upon the excitation to 972 nm.

As shown in FIG. 7, when the up-conversion nanoparticles are excited to a wavelength of 972 nm within a range of near infrared rays according to the present disclosure, light emission occurs with a wavelength of 542 nm and 656 nm through the wavelength conversion.

In the case of the structure including up-conversion particles according to Comparative Example 1, photoluminescence intensity is significantly low. On the other hand, the wavelength converting structure for near infrared rays according to Example 7 shows a photoluminescence intensity at least 1,000 times higher than the photoluminescence intensity of the structure according to Comparative Example 1.

To determine the effect of a variation in thickness of each of the first spacer layer and the second spacer layer on the wavelength converting structure for near infrared rays disclosed herein, the photoluminescence intensity is measured for each of the wavelength converting structure for near infrared rays according to Examples 1 to 8.

Figure 8:
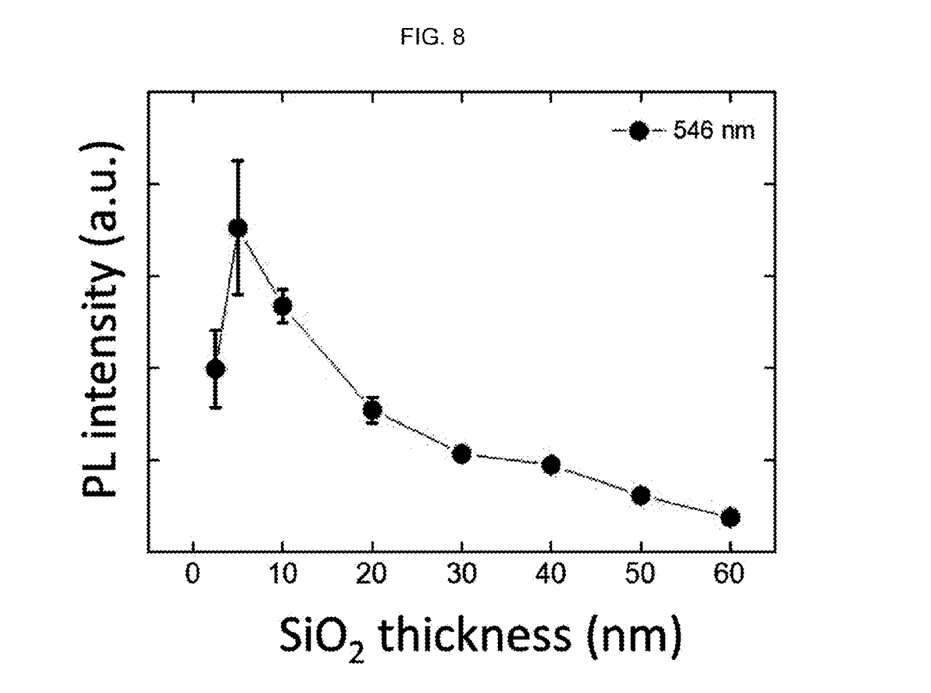
FIG. 8 is a graph illustrating the light intensity of the wavelength converting structure for near infrared rays according to Examples 1-8 at 546 nm.
Figure 9:
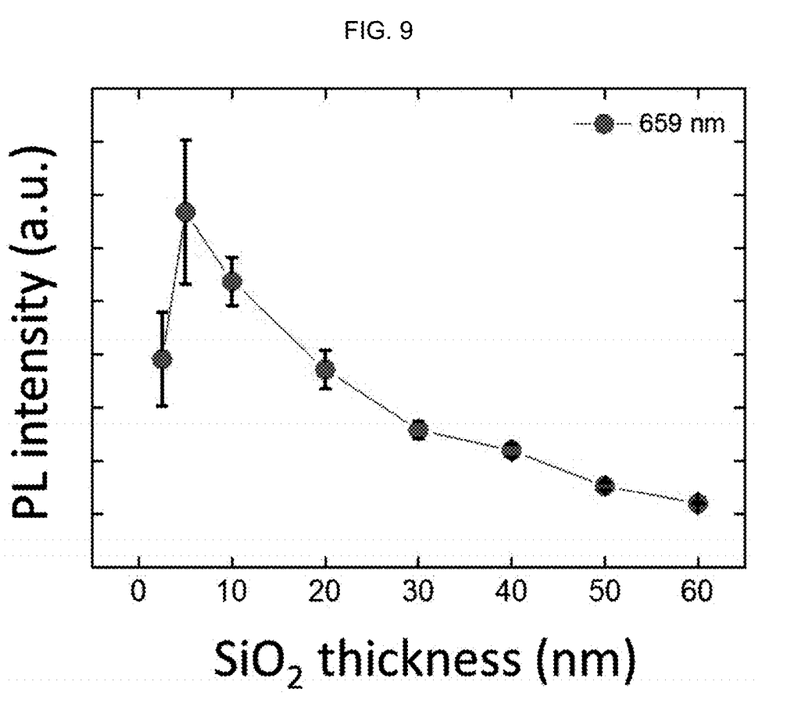
FIG. 9 is a graph illustrating the light intensity of the wavelength converting structure for near infrared rays according to Examples 1-8 at 659 nm.

FIG. 8 is a graph illustrating the light intensity of the wavelength converting structure for near infrared rays according to Examples 1-8 at 546 nm. FIG. 9 is a graph illustrating the light intensity of the wavelength converting structure for near infrared rays according to Examples 1-8 at 659 nm.

As shown in FIG. 8 and FIG. 9, the photoluminescence intensity increases as the thickness of each of the first spacer layer and the second spacer layer decreases.

The wavelength converting structures for near infrared rays according to Examples 1, 2, 3 and 4 show the highest photoluminescence intensity. As a result, it can be seen that even when the first spacer layer and the second spacer layer have a thickness of 1-60 nm, the wavelength converting structure for near infrared rays according to the present disclosure shows significantly higher wavelength conversion efficiency as compared to the structure according to Comparative Example 1.

However, as shown in FIG. 8 and FIG. 9, at the highest photoluminescence intensity, each of the first spacer layer and the second spacer layer has a thickness of 1-30 nm, more preferably 1-20 nm.

The wavelength converting structure for near infrared rays according to the present disclosure allows for the incident light or the light converted into visible rays by up-conversion particles to undergo light trapping between the first metal layer and the second metal layer due to the gap plasmon in which localized surface plasmon is combined with surface plasmon polariton. When the wavelength converting structure for near infrared rays has a first spacer layer and second spacer layer formed to have a thickness of the above-defined range, the light trapping characteristics may be maximized. Thus, it is preferred for the first spacer layer and the second spacer layer to maintain the above-defined thickness.

What is claimed is:

1. A wavelength converting structure for near infrared rays, comprising:
    a first metal layer;
    a first spacer layer attached to the surface of the first metal layer;
    an up-conversion nanoparticle layer dispersed onto the surface of the first spacer layer;
    a second spacer layer formed on the up-conversion nanoparticle layer; and
    a second metal layer comprising a plurality of metal nanoparticles formed on the second spacer layer.

2. The wavelength converting structure for near infrared rays according to claim 1, which converts near infrared rays with a wavelength range of 900-1500 nm into visible rays with a wavelength range of 400-800 nm.

3. The wavelength converting structure for near infrared rays according to claim 1, which further comprises a substrate on the bottom surface of the first metal layer.

4. The wavelength converting structure for near infrared rays according to claim 1, wherein each of the first spacer layer and the second spacer layer independently comprises a semiconductor material, oxide, nitride or a mixture thereof.

5. The wavelength converting structure for near infrared rays according to claim 1, wherein each of the first spacer layer and the second spacer layer has a thickness of 1-60 nm.

6. The wavelength converting structure for near infrared rays according to claim 1, wherein the metal nanoparticles of the second metal layer are formed periodically or non-periodically.

7. The wavelength converting structure for near infrared rays according to claim 6, wherein when the metal nanoparticles are formed non-periodically, they are in the form of islands and the island-like metal nanoparticles are dispersed irregularly.

8. The wavelength converting structure for near infrared rays according to claim 6, wherein when the metal nanoparticles are formed periodically, they have any one shape selected from the group consisting of a triangle, circle, ellipse, rhombus and a polygon having a predetermined curvature, and the metal nanoparticles are aligned at an interval of 10-500 nm.

9. The wavelength converting structure for near infrared rays according to claim 1, wherein each of the first metal layer and the second metal layer independently comprises at least one metal selected from the group consisting of gold, silver, aluminum, nickel, cobalt, iron, zinc, chrome and platinum.

10. The wavelength converting structure for near infrared rays according to claim 1, wherein the up-conversion nanoparticles have a diameter of 5-100 nm.

11. The wavelength converting structure for near infrared rays according to claim 1, wherein the up-conversion nanoparticle is any one selected from the group consisting of halides, chalcogenides and metal oxides doped with ytterbium (Yb), erbium (Er) or a mixture thereof.

12. A solar cell comprising:
    a first electrode layer comprising the wavelength converting structure for near infrared rays as defined in claim 1;
    a first transparent electrode layer formed on the first electrode layer;
    a photoactive layer formed on the first transparent electrode layer;
    a second transparent electrode layer formed on the photoactive layer; and
    a second electrode layer formed on the second transparent electrode layer.

13. The solar cell according to claim 12, wherein each of the first transparent electrode layer and the second transparent electrode layer comprises any one transparent conductive metal oxide selected from the group consisting of indium tin oxide (ITO), fluorine tin oxide (FTO), indium zinc oxide (IZO), tin oxide (TO), antimony tin oxide (ATO), zinc oxide, Al-doped zinc oxide, cadmium oxide (CdO), cadmium tin oxide ($CdSnO_4$) and a mixture thereof.

14. The wavelength converting structure for near infrared rays according to claim 1, wherein the up-conversion nanoparticle layer comprises a composition of $\beta$-$NaY_{0.8}F_4$:$Yb^{3+}_{0.18}$,$Er^{3+}_{0.02}$.

15. A wavelength converting structure comprising:
    a first metal layer;
    a first spacer layer on the first metal layer;
    an up-conversion nanoparticle layer on the first spacer layer;
    a second spacer layer on the up-conversion nanoparticle layer; and
    a second metal layer comprising a plurality of metal nanoparticles partially coated on the second spacer layer.

16. The wavelength converting structure according to claim 15, wherein
    each of the first spacer layer and the second spacer layer independently comprises a semiconductor material, oxide, nitride or a mixture thereof;
    the first spacer layer and the second spacer layer both have a thickness of 1-60 nm;
    the metal nanoparticles of the second metal layer are formed periodically or non-periodically;
    when the metal nanoparticles are formed non-periodically on the second spacer layer then the metal nanoparticles are dispersed irregularly on the second spacer layer;
    when the metal nanoparticles are formed periodically on the second spacer layer then the metal nanoparticles comprise a shape selected from the group consisting of a triangle, circle, ellipse, rhombus and a polygon having a curvature, and the metal nanoparticles are aligned on the second spacer layer at an interval of 10-500 nm;
    the first metal layer and the second metal layer both independently comprise at least one metal selected from the group consisting of gold, silver, aluminum, nickel, cobalt, iron, zinc, chrome and platinum; and
    the up-conversion nanoparticle layer comprises up-conversion nanoparticles composed of any one selected from the group consisting of halides, chalcogenides and metal oxides doped with ytterbium (Yb), erbium (Er) or a mixture thereof.

17. The wavelength converting structure according to claim 15, wherein the up-conversion nanoparticle layer comprises $\beta$-$NaY_{0.8}F_4$:$Yb^{3+}_{0.18}$,$Er^{3+}_{0.02}$.

18. The wavelength converting structure according to claim 15, further comprising a substrate on the first metal layer in which the first metal layer between the substrate and the first spacer layer.

19. A solar cell comprising:
a first metal layer;
a first spacer layer on the first metal layer;
an up-conversion nanoparticle layer on the first spacer layer;
a second spacer layer on the up-conversion nanoparticle layer;
a second metal layer comprising a plurality of metal nanoparticles partially coated on the second spacer layer;
a first transparent electrode layer on both the second spacer layer and on the second metal layer;
a photoactive layer on the first transparent electrode layer;
a second transparent electrode layer on the photoactive layer; and
a second electrode layer on the second transparent electrode layer.

20. The solar cell of claim 19, wherein
the up-conversion nanoparticle layer comprises $\beta\text{-NaY}_{0.8}\text{F}_4\text{:Yb}^{3+}{}_{0.18}\text{,Er}^{3+}{}_{0.02}$;
each of the first transparent electrode layer and the second transparent electrode layer comprises any one transparent conductive metal oxide selected from the group consisting of indium tin oxide (ITO), fluorine tin oxide (FTO), indium zinc oxide (IZO), tin oxide (TO), antimony tin oxide (ATO), zinc oxide, Al-doped zinc oxide, cadmium oxide (CdO), cadmium tin oxide ($CdSnO_4$) and a mixture thereof;
the photoactive layer comprises any one selected from the group consisting of an amorphous silicone, CIGS ($CuInGaSe_2$), CdTe, CIS ($CuInSe_2$), and CZTS ($Cu_2ZnSnS_4$);
the second electrode layer comprises any one selected from the group consisting of gold, silver, aluminum, calcium, magnesium, vanadium, molybdenum, Al—Mg and LiF—Al;
the first spacer layer and the second spacer layer independently comprises a semiconductor material, oxide, nitride or a mixture thereof; and
the first metal layer and the second metal layer independently comprises at least one metal selected from the group consisting of gold, silver, aluminum, nickel, cobalt, iron, zinc, chrome and platinum.

* * * * *